United States Patent
Ciou et al.

(10) Patent No.: US 9,282,645 B2
(45) Date of Patent: Mar. 8, 2016

(54) LASER PATTERNING OF FRAME WIRE AREA ON TOUCH PANEL

(71) Applicant: Industrial Technology Research Institute, Hsinchu (TW)

(72) Inventors: Jyun-Kai Ciou, Changhua County (TW); Chia-Sheng Huang, Yilan County (TW); Ching-Chih Wei, Hsinchu (TW); Ya-Chun Shih, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 86 days.

(21) Appl. No.: 14/107,948

(22) Filed: Dec. 16, 2013

(65) Prior Publication Data
US 2015/0169090 A1 Jun. 18, 2015

(51) Int. Cl.
*H05K 3/02* (2006.01)
*G06F 3/041* (2006.01)

(52) U.S. Cl.
CPC ............... *H05K 3/027* (2013.01); *G06F 3/041* (2013.01)

(58) Field of Classification Search
CPC .... G06F 3/041; G09G 23/0404; H05K 3/027; H05K 3/0026
See application file for complete search history.

(56) References Cited

U.S. PATENT DOCUMENTS

| | | | |
|---|---|---|---|
| 4,970,366 A | 11/1990 | Imatou et al. | |
| 5,091,286 A | 2/1992 | Person | |
| 6,448,158 B2 | 9/2002 | Peng et al. | |
| 6,576,866 B1 | 6/2003 | Karg | |
| 6,937,230 B2 * | 8/2005 | Hatakeda et al. | 345/173 |
| 7,879,712 B2 | 2/2011 | Cheng et al. | |
| 7,994,029 B2 | 8/2011 | Cheng et al. | |
| 8,420,978 B2 | 4/2013 | Jain et al. | |
| 2001/0053560 A1 | 12/2001 | Shinohara et al. | |
| 2002/0016075 A1 | 2/2002 | Peng et al. | |
| 2007/0245956 A1* | 10/2007 | Ruuttu et al. | 118/620 |
| 2009/0221141 A1 | 9/2009 | Cheng et al. | |
| 2010/0117985 A1 | 5/2010 | Wadia | |
| 2011/0134056 A1 | 6/2011 | Kim et al. | |
| 2012/0015471 A1* | 1/2012 | Wang et al. | 438/73 |

(Continued)

FOREIGN PATENT DOCUMENTS

CN 1642490 A 7/2005
CN 102227703 A 10/2011

(Continued)

OTHER PUBLICATIONS

Ivor Brodie et al., "A Multiple-Electron-Beam Exposure System for High-Throughput, Direct-Write Submicrometer Lithgraphy," IEEE Transactions on Electron Devices, Nov. 1981, pp. 1422-1428, vol. ED-28, No. 11, IEEE, US.
Dean J. Kratzer et al., "High-Speed Pattern Generator and GaAs Pin Electronics for a Gigahertz Production Test System," 1988 International Test Conference, Sep. 1988, pp. 710-718, IEEE, US.
S. Miyajima et al., "High-Throughput RSFQ Signal Processor for a Neutron Diffraction System with Multiple MgB2 Detectors," IEEE Transactions on Applied Superconductivity, Jun. 2013, 5 pages, vol. 23, No. 3, IEEE, US.

(Continued)

*Primary Examiner* — Liliana Cerullo

(57) ABSTRACT

A laser patterning touch panel includes an active area, an inactive area, and a plurality of first coaxial patterns. The active area is disposed in a center area of the substrate. The inactive area does not overlap the active area and has a transparent conductive layer thereon. The plurality of first coaxial patterns are disposed on the transparent conductive layer and surround the active area. Each of the plurality of first coaxial patterns includes a continuous line segment with a width, and partially overlaps with a neighboring one of the first coaxial patterns.

13 Claims, 10 Drawing Sheets

(56) References Cited

U.S. PATENT DOCUMENTS

| | | | |
|---|---|---|---|
| 2012/0175235 A1* | 7/2012 | Jiang et al. | 200/600 |
| 2014/0028582 A1* | 1/2014 | Choi | 345/173 |

FOREIGN PATENT DOCUMENTS

| | | |
|---|---|---|
| TW | 200937504 | 9/2009 |
| TW | 201243665 A1 | 11/2012 |
| TW | 201308554 A1 | 2/2013 |

OTHER PUBLICATIONS

David M. Kingsley et al., "High-Throughput, Laser-based Alginate Microbead Fabrication and Patterning," 2013 39th Annual Northeast Bioengineering Conference, Apr. 2013, pp. 53-54, IEEE, US.

Jung-Hun Seo et al., "Large-Area Printed Broadband Membrane Reflectors by Laser Interference Lightography," IEEE Photonics Journal, Feb. 2013, 7 pages, IEEE, US.

Taiwan Patent Office, Office Action, Patent Application Serial No. 102146361, Aug. 7, 2015, Taiwan.

* cited by examiner

LASER PATTERNING OF FRAME WIRE AREA ON TOUCH PANEL

TECHNICAL FIELD

The disclosure relates to a patterned touch panel, and in particular to a laser-patterned touch panel.

BACKGROUND

With the rise of planar display panels, touch panels have become main stream in the market, and have replaced input devices such as keyboards, mouse devices, etc., such that the operation of electronic information products is much easier and simpler. In general, electronic products adopting touch panels include vehicle navigation, gaming laptops, cell phones, ATMs, electronic books, etc., such that the demands of the touch panel have increased dramatically in the market.

Methods of patterning touch panels are mainly implemented by laser patterning. Besides the laser patterning in the active area of the touch panel, the inactive area is also patterned to remove the conductive film (transparent conductive layer). For example, laser patterning an active area of a 3.5" touch panel takes 30 seconds, but laser patterning inactive area of a 3.5" touch panel will take 3 minutes. As a result, it is an important task to effectively improve patterning of the inactive area of touch panels.

SUMMARY

The disclosure is directed to a laser-patterned touch panel, which provides an improved pattern for a reduced time cost of patterning and good quality.

According to an embodiment of the disclosure, a laser-patterned touch panel comprises an active area, an inactive area and a plurality of first coaxial patterns. The active area is configured at a center of the touch panel. The inactive area does not overlap with the active area, and has a transparent conductive layer disposed thereon. The plurality of first coaxial patterns are disposed on the transparent conductive layer and surround the active area. Each pattern of the first coaxial patterns is formed of a continuous line segment with a first width, and partially overlaps with a neighboring coaxial pattern of the first coaxial patterns.

According to anther embodiment of the disclosure, a method of forming a laser-patterned touch panel comprises: providing a touch panel with an active area; forming a transparent conductive layer disposed on a surface which is out of the active area; and forming a plurality of first coaxial patterns on the transparent conductive layer and surrounding the active area. Wherein each of the first coaxial patterns is formed of a continuous line segment with a first width, and partially overlaps with a neighboring coaxial pattern of the first coaxial patterns. Wherein forming the first coaxial patterns is executed in sequence from an outer edge of the touch panel to the active area, or from the active area to the outer edge of the touch panel.

In order to make the disclosure comprehensible, several exemplary embodiments accompanied with figures are described in detail below.

BRIEF DESCRIPTION OF DRAWINGS

The application can be more fully understood by reading the subsequent detailed description and exemplary embodiments with references made to the accompanying drawings, wherein.

DETAILED DESCRIPTION OF THE EMBODIMENTS

FIG. 1 to FIG. 4 are schematic diagrams of a coaxial pattern of a touch panel in a first embodiment of the disclosure. The following description provides a method of laser patterning a touch panel in the embodiment with refer to FIG. 1.

Figure 1:
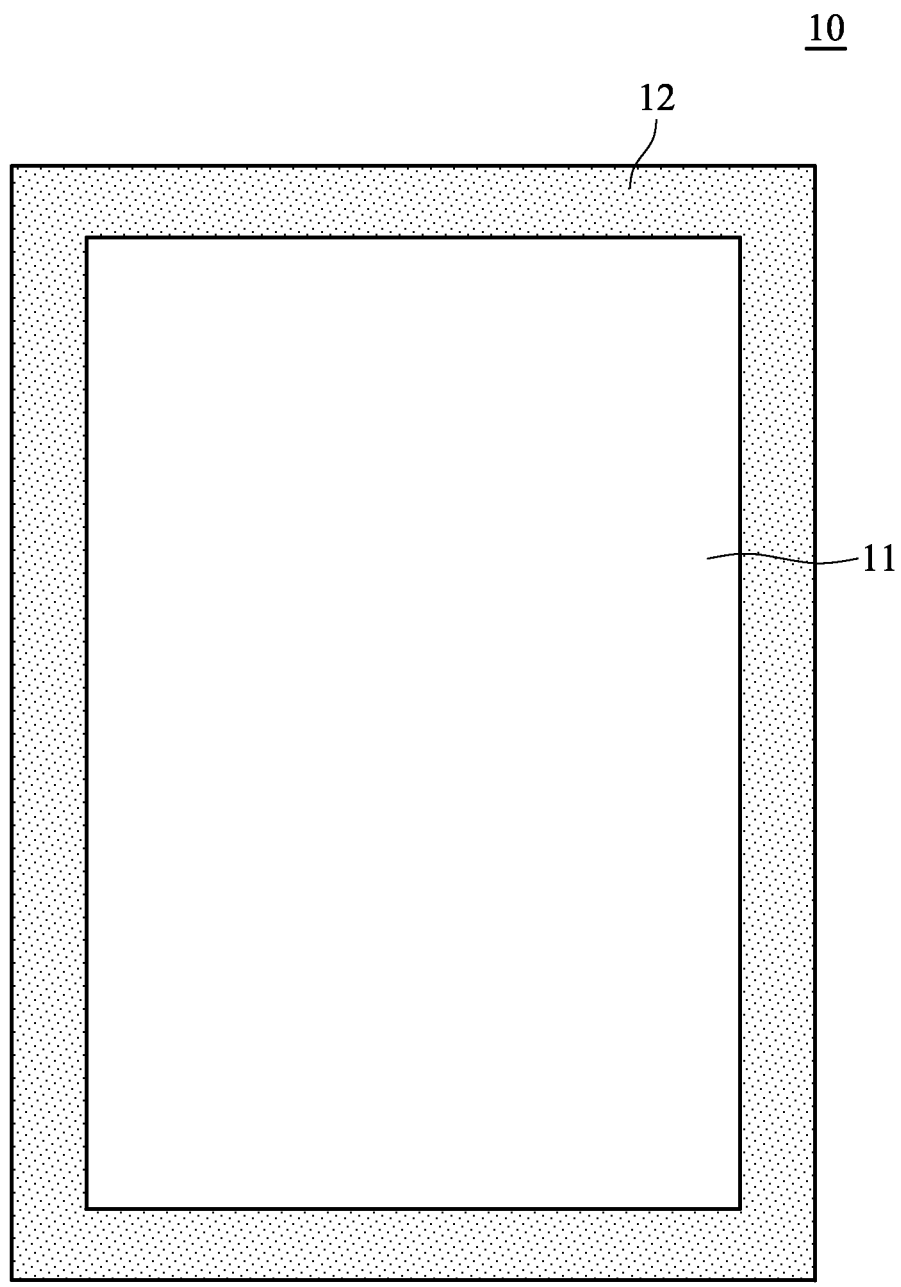
FIG. 1 is a schematic diagram of a touch panel in a first embodiment of the disclosure.

Refer to FIG. 1, a touch panel 10 is provided. The touch panel 10 includes an active area 11 and an inactive area 12, and a transparent conductive layer is disposed on the touch panel 10 to be patterned for electrical connection. For example, the transparent conductive layer disposed on the inactive area 12 can be removed for providing an insulation layer, and further a patterned conductive layer can be disposed on the insulation layer for electrically connecting the active area 11 and other electric components, but the disclosure is not limited thereto. In this embodiment, the touch panel 10 is fabricated by ultra-thin flexible glass, PET, PC, or polymide. The transparent layer on the touch panel 10 can be formed using ITO (Indium Tin Oxide), ZnO, silver nanowire, carbon nanotube, graphene, or PEDOT, and a thickness of the transparent conductive layer is between 60 to 80 nm, but the disclosure is not limited thereto. It is noted that the active area 11 can be patterned before or after the inactive area 12 is patterned, and the disclosure is not limited thereto.

Figure 2:
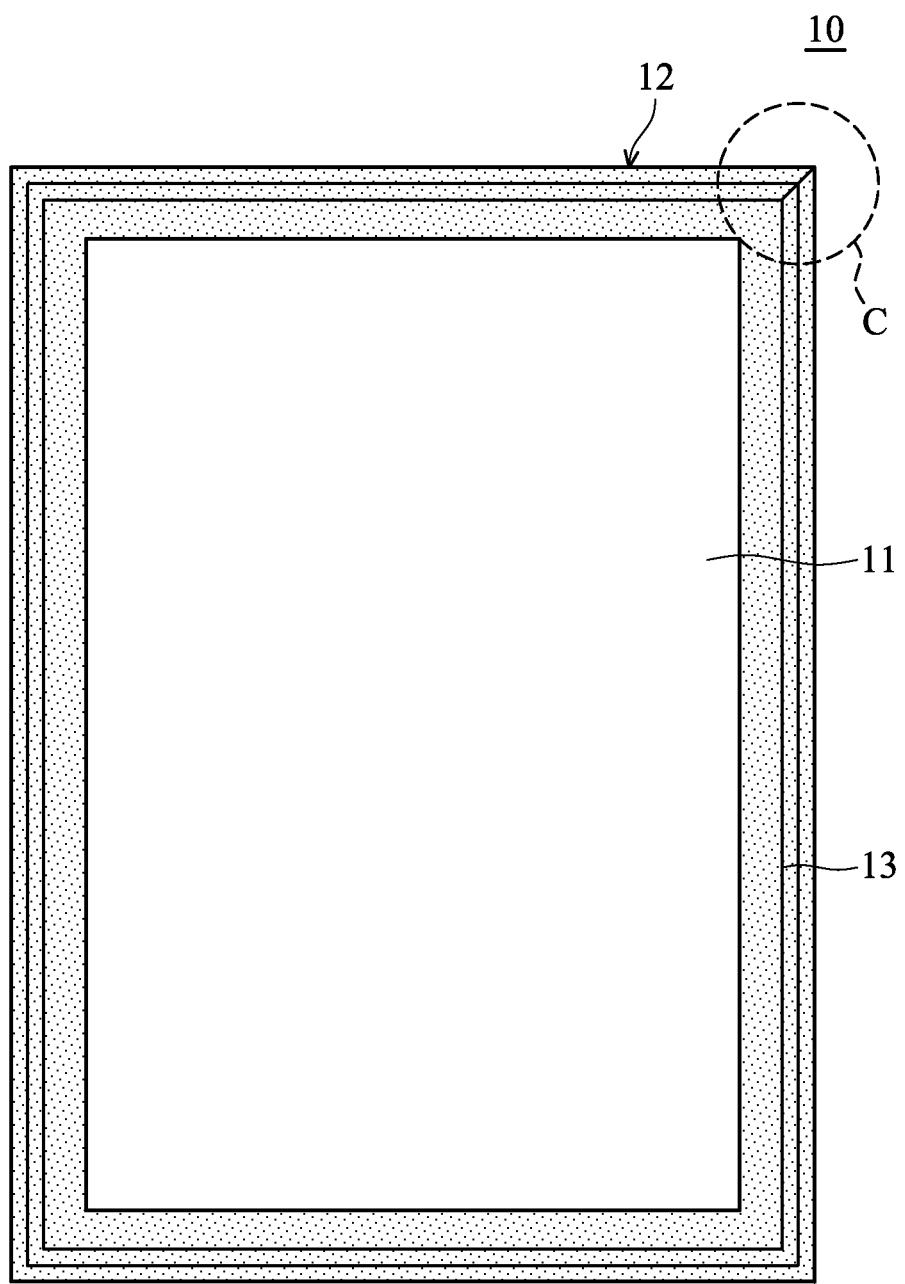
FIG. 2 is a schematic diagram of a coaxial pattern of the touch panel in the first embodiment of the disclosure.
Figure 3A:
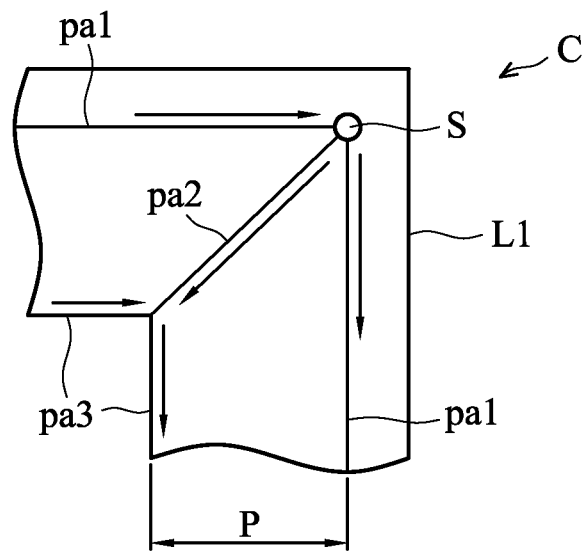
FIG. 3A is a partial enlarged schematic diagram of a coaxial pattern route of the touch panel in the first embodiment of the disclosure.
Figure 3B:
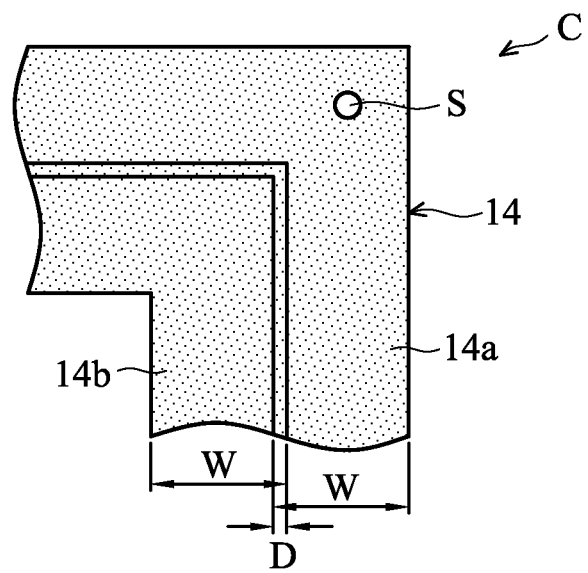
FIG. 3B is a partial enlarged schematic diagram of a coaxial pattern of the touch panel in the first embodiment of the disclosure.

Refer to FIGS. 2 and 3A-3B, FIG. 2 is a schematic diagram of a coaxial pattern of a touch panel in a first embodiment of the disclosure. FIG. 3A is partial enlarged schematic diagram of a coaxial pattern route in area C of the touch panel in the first embodiment of the disclosure. FIG. 3B is partial enlarged schematic diagram of a coaxial pattern in area C of the touch panel in the first embodiment of the disclosure.

In FIG. 2, a plurality of first coaxial patterns 13 are formed on the inactive area 12 of the touch panel 10. The plurality of first coaxial patterns 13 comprise a plurality of patterns (or routes of patterns) with same axle center and the intervals between each two neighboring patterns are the same, but the disclosure is not limited thereto. For example, in one embodiment, the plurality of first coaxial patterns 13 can comprise a plurality patterns with same axle center and the intervals between each two neighboring patterns are the same. For simplified explanation, the plurality of first coaxial patterns 13 is illustrated only by two patterns with same axle center and the intervals between the two patterns are the same, but the disclosure is not limited thereto. In another embodiment, the touch panel 10 is divided into the active area 11 and the inactive area 12, the inactive area 12 does not overlap with the active area 11, and a transparent conductive layer is disposed on the inactive area 12.

Refer to FIG. 3A, FIG. 3A is partial enlarged schematic diagram of a coaxial pattern route in area C of the touch panel in the first embodiment of the disclosure. A method for forming of the plurality of first coaxial patterns 13 in the embodiment is provided as follows. Firstly, a patterning process is started at start point S. The start point S can be configured near an outer edge L1 of the inactive area 12, or any other place, which is near the active area 11, in the inactive area 12. In the embodiment, the start point S is at a corner near the outer edge L1 in the inactive area 12, but the disclosure is not limited thereto. Then, the patterning process begins at the start point S along the outer edge L1 in a clockwise or a counter-clockwise way. For simplified explanation, the patterning process is illustrated in a clockwise manner in the embodiment, but the disclosure is not limited thereto. After the patterning process return to the start point S along the outer edge L1 in a clockwise way, a non-repeated patterning route is proceeded from the start point S to the active area 11. When the non-repeated patterning process reaches a distance P to the pattern formed started at the starting point S, the patterning process continues to proceed in a clockwise or a counter-clockwise way. By repeating the above patterning process, the plurality of first coaxial patterns 13 is formed in the inactive area 12 on the touch panel 10. For example, the patterning process begins at the start point S along the route pa1 in a clockwise way, returns to the start point S, then begins along route pa2 toward the active area 11, and begins along the route pa3 to implement the pattern.

Refer to FIG. 3B, FIG. 3B is a partial enlarged schematic diagram of a coaxial pattern of the touch panel in the first embodiment of the disclosure. The first coaxial pattern 13 is formed of a continuous line segment with a width W, and the width W is larger than the interval P between patterns in the plurality of first coaxial patterns 13. As a result, an overlap area D is formed between neighboring patterns in the plurality of first coaxial patterns 13. The transparent conductive layer in the inactive area 12 is removed by the plurality of first coaxial patterns 13, so an insulation area 14 is formed. For example, the insulation area 14 comprises insulation areas 14a and 14b. In the embodiment, the insulation area 14a is formed by the patterning route pa1 in FIG. 3A, the insulation area 14b is formed by the patterning route pa3 in FIG. 3A, but the disclosure is not limited thereto. In the embodiment, the width W is between 10 um to 40 um, the interval P is between 15 um to 20 um, but the disclosure is not limited thereto. A resistance of the insulation area 14 is at least larger than 20M Ohm. In still another embodiment, the removed transparent conductive layer retains a thickness between 0 nm to 20 nm in the insulation area 14, but the disclosure is not limited thereto.

Figure 4:
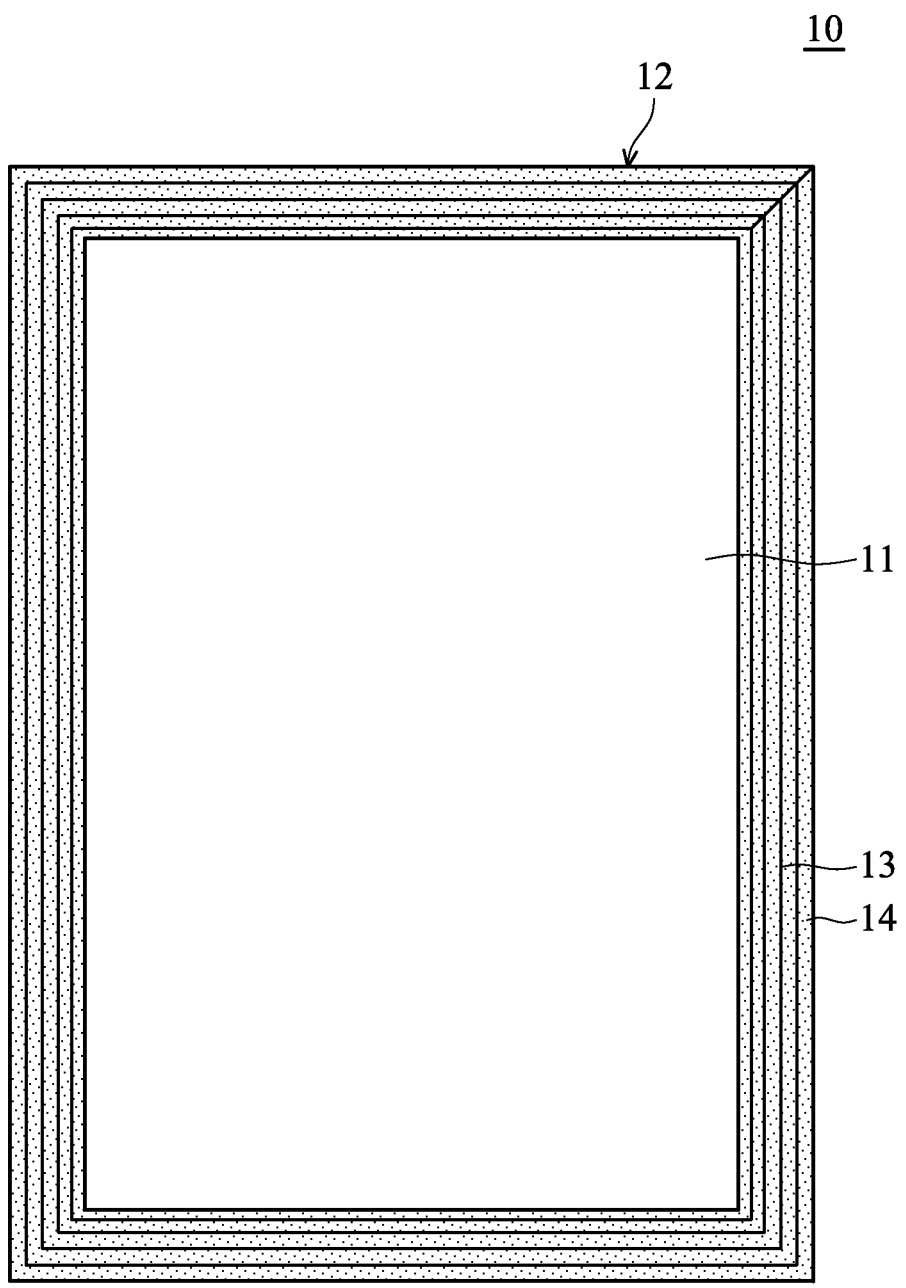
FIG. 4 is a schematic diagram of a coaxial pattern of the touch panel in the first embodiment of the disclosure.

Refer to FIG. 4, FIG. 4 is a schematic diagram of a coaxial pattern of the touch panel in the first embodiment of the disclosure. By performing the patterning process described above, the plurality of first coaxial patterns 13 are formed in the inactive area 12. Each of the plurality of first coaxial patterns 13 partially overlaps a neighboring pattern of the first coaxial patterns 13 to form the insulation area 14. In the embodiment, the insulation area 14 can entirely or partially cover the inactive area 12. For example, the patterning process can be finished without patterning the outer edge L1 of the inactive area 12. Although the insulation area 14 is illustrated as entirely covering the inactive area 12 in the embodiment, but the disclosure is not limited thereto.

Figure 5A:
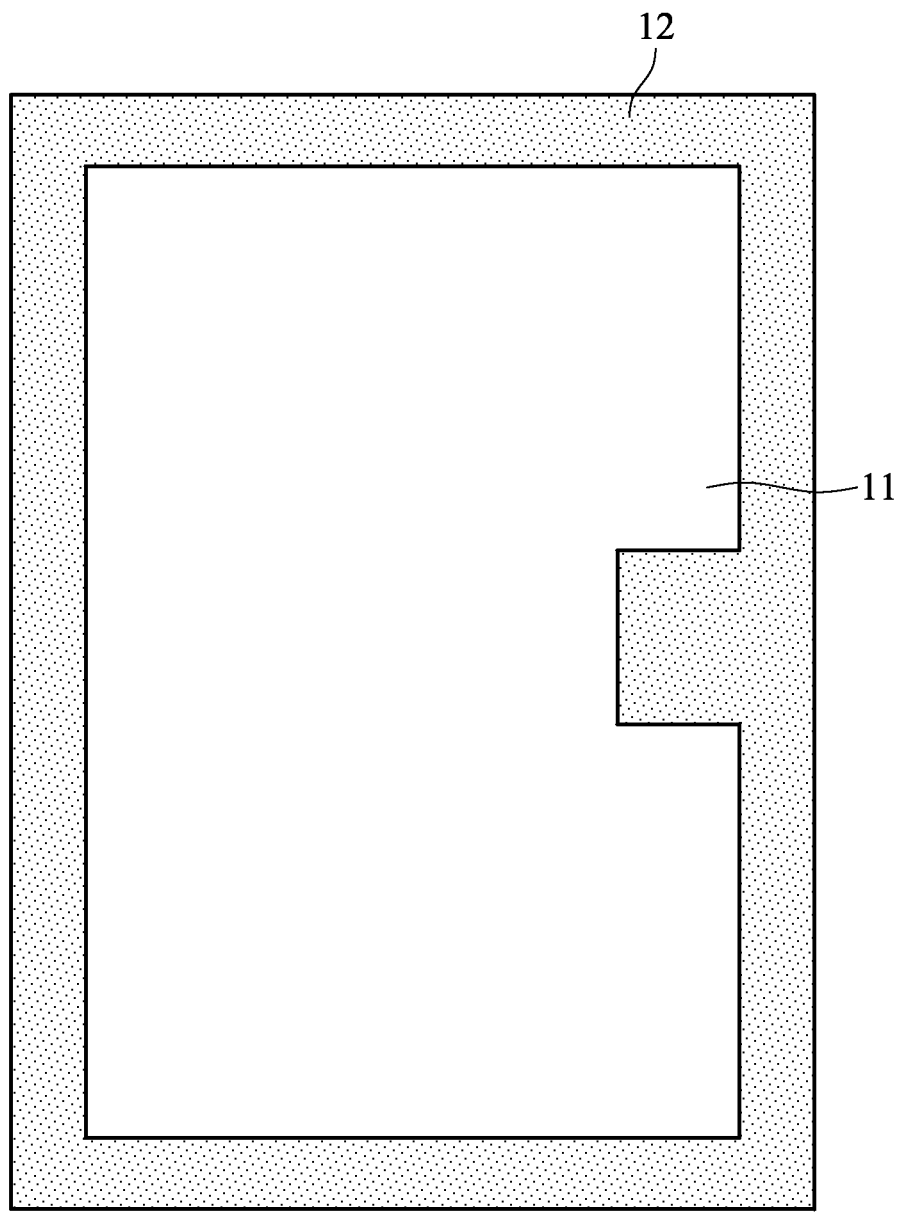
FIG. 5A and FIG. 5B are schematic diagrams of a coaxial pattern of a touch panel in a second embodiment of the disclosure.
Figure 5B:
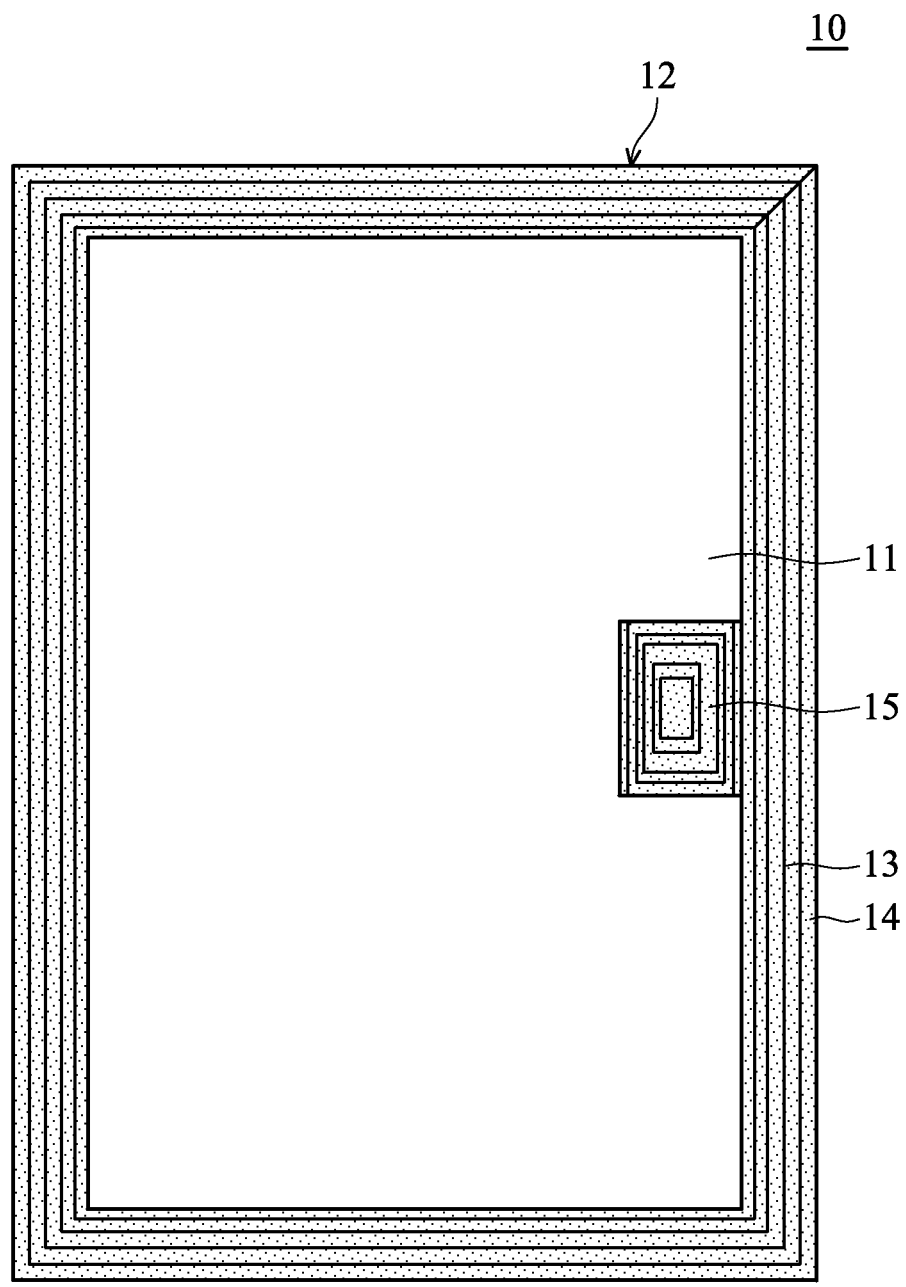

FIGS. 5A and 5B are schematic diagrams of a coaxial pattern of a touch panel in a second embodiment of the disclosure. The second embodiment is different from the first embodiment in coverage area of inactive area 12. Besides the plurality of first coaxial patterns 13, a plurality of second coaxial patterns 15 are formed between the active area 11 and the plurality of first coaxial patterns 13 to form the insulation area 14. Methods of forming the plurality of second coaxial patterns 15 can be referred to in the methods of forming the plurality of first coaxial patterns 13 illustrated in the first embodiment.

Figure 5C:
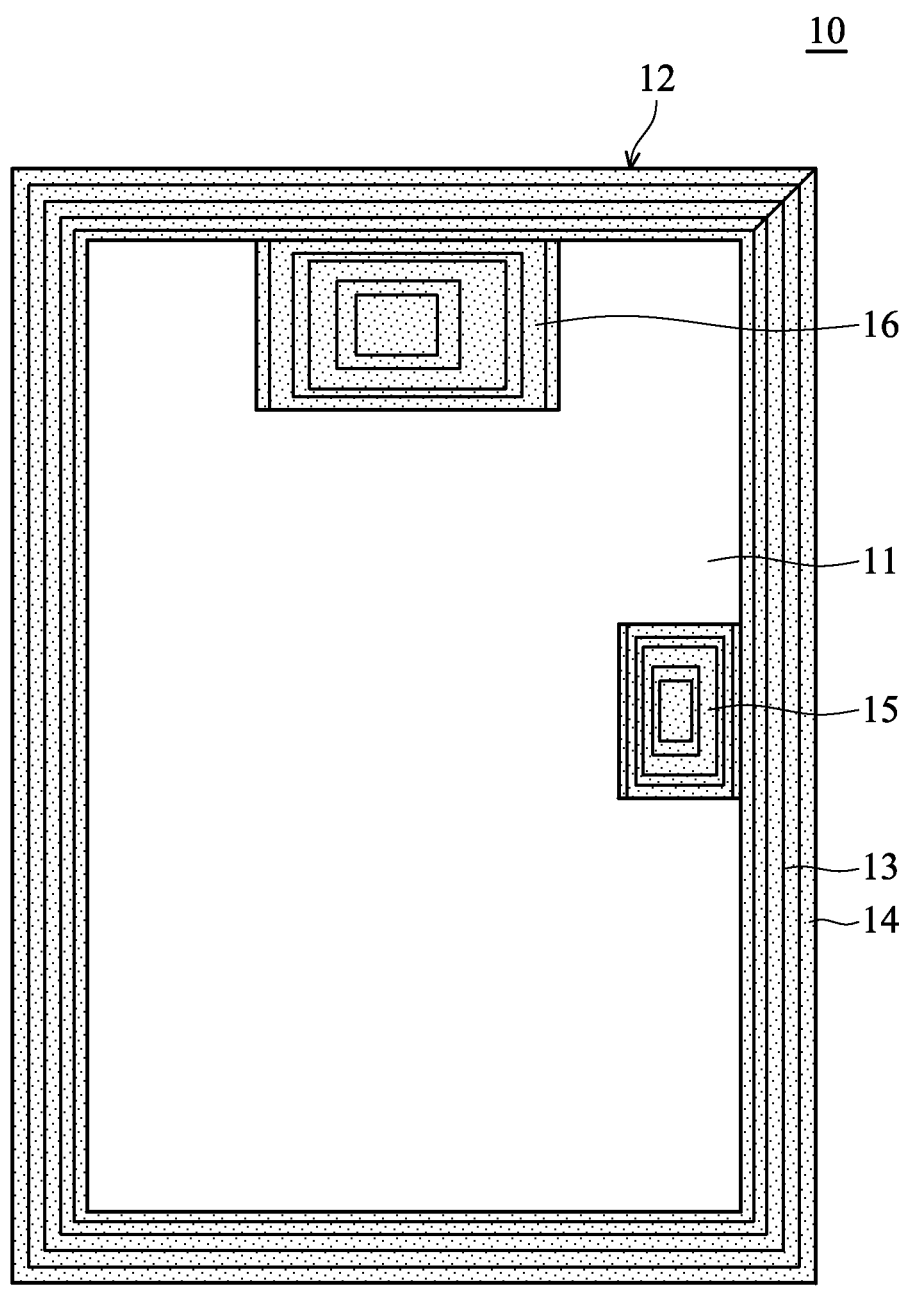
FIG. 5C is a schematic diagrams of a coaxial pattern of a touch panel in a third embodiment of the disclosure.

FIG. 5C is a schematic diagram of a coaxial pattern of a touch panel in a third embodiment of the disclosure. The coverage area of the inactive area 12 is also different from the second embodiment, and a plurality of third coaxial patterns 16 are further formed between the plurality of first coaxial patterns 13 and the active area 11 to form the insulation area 14.

Figure 6:
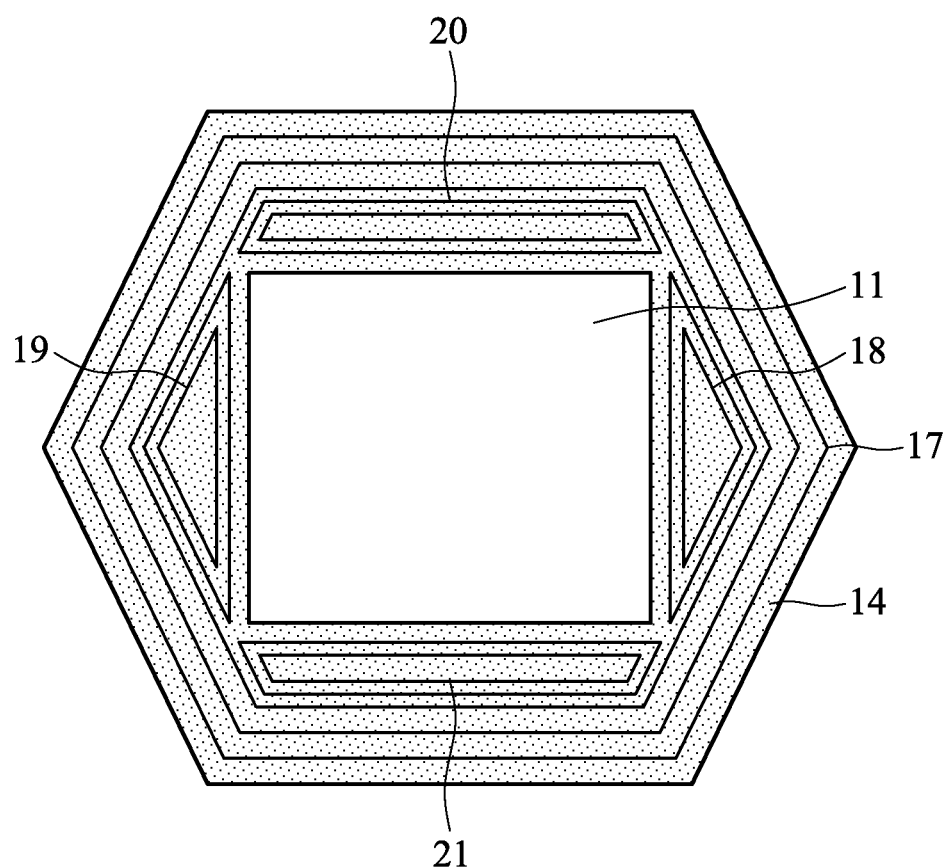
FIG. 6 is a schematic diagram of a coaxial pattern of a touch panel in a fourth embodiment of the disclosure.

FIG. 6 is a schematic diagram of a coaxial pattern of a touch panel in a fourth embodiment of the disclosure. In the embodiment, coaxial patterns 17, 18, 19, 20, and 21 are formed in the inactive area 12, and can be adjusted by a person with general knowledge in this technical field to form the insulation area 14.

Figure 7A:
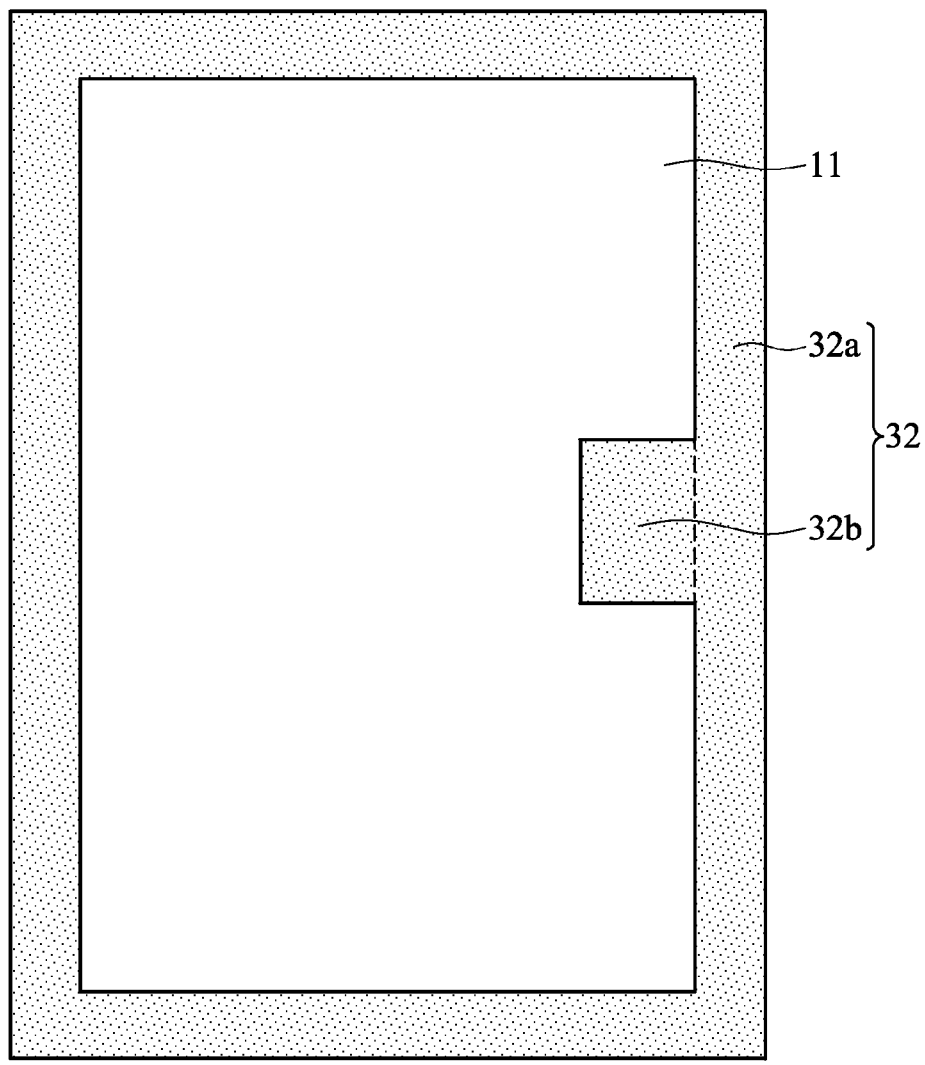
FIGS. 7A and 7B are schematic diagrams of a coaxial pattern of a touch panel in a fifth embodiment of the disclosure.
Figure 7B:
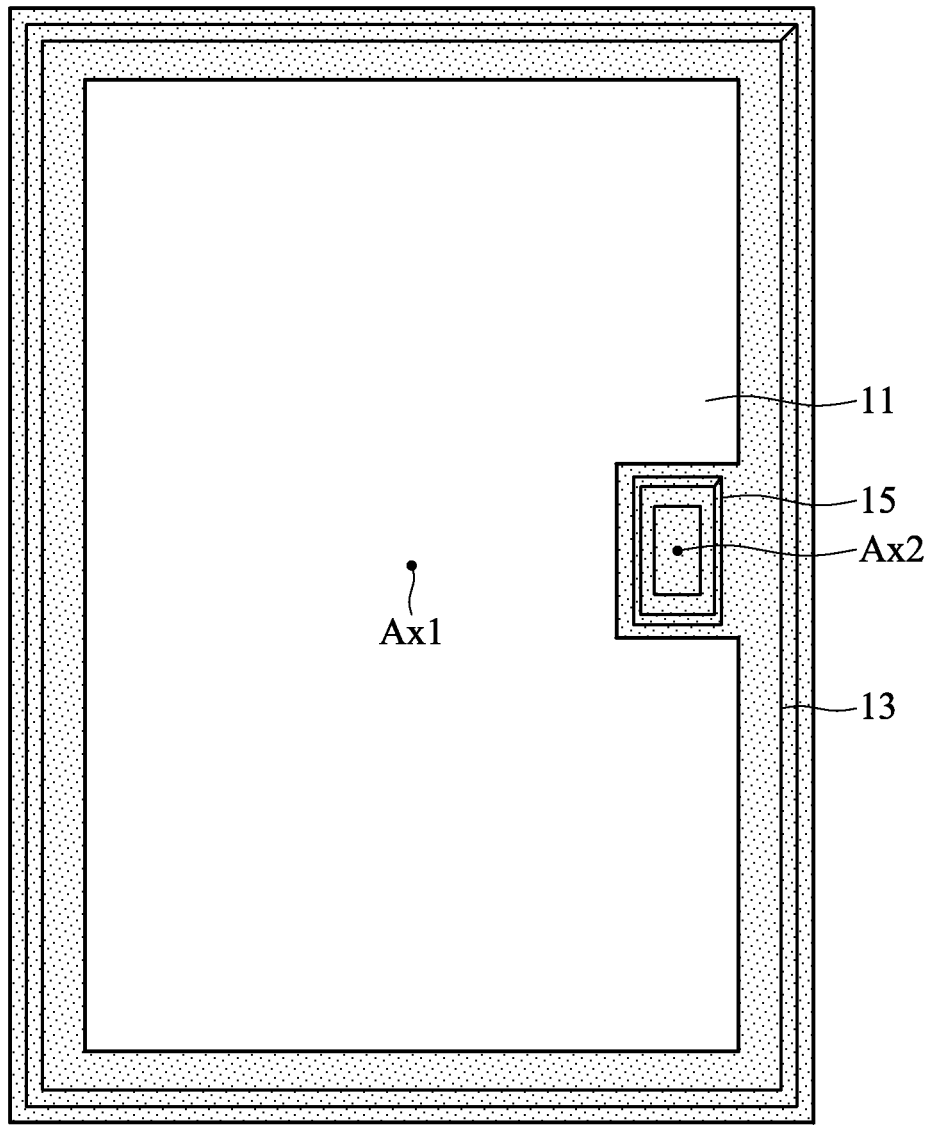

FIGS. 7A and 7B are schematic diagrams of a coaxial pattern of a touch panel in a fifth embodiment of the disclosure. In FIG. 7A, the touch panel 10 comprises the active area 11 and the inactive area 32. In the embodiment, the inactive area 32 is configured as an area without being overlapped with the active area 11. For example, the inactive area 32 comprises a first inactive area 32a and a second inactive area 32b. In the embodiment, the first inactive area 32a is not overlapped with the second inactive area 32b. In one embodiment, the active area 11 is configured at the center of the touch panel 10, but the disclosure is not limited thereto. In another embodiment, the first inactive area 32a and the second inactive area 32b can be regarded as an inactive area surrounding the active area 11.

Refer to FIG. 7B, FIG. 7B is a schematic diagram which illustrates removing the transparent conductive layer on the inactive area by laser pattern etching. In FIG. 7B, the plurality of first coaxial patterns 13 are disposed in the first inactive area 32a, and the plurality of second coaxial patterns 15 are disposed in the second inactive area 32b. In the embodiment, the plurality of first coaxial patterns 13 surround a first axle center. In one embodiment, the first axle center can be configured at the center or center of gravity of the first inactive area 32a, but the disclosure is not limited thereto. In another embodiment, the active area 11 is configured at center of the touch panel 10, and when the first inactive area 32a surrounds active area 11, the first axle center Ax1 can be configured as the center or center of gravity of the active area 11. In a similar way, the plurality of second coaxial patterns 15 surround a second axle center Ax2, the axle center Ax2 can be configured as center of gravity or center of the second inactive area 32b.

In the embodiment, the transparent conductive layer on the first inactive area 32a is removed by the routes of the plurality of first coaxial patterns 13 to form a first insulation area. In a similar way, the transparent conductive layer on the second inactive area 32b is removed by the routes of the plurality of second coaxial patterns 15 to form a second insulation area. Each of the plurality of first coaxial patterns 13 is formed of a continuous line segment with a first width, and partially overlaps with a neighboring patterning the first coaxial patterns 13. The plurality of second coaxial patterns 15 is formed of another continuous line segment with a second width, and partially overlaps with a neighboring pattern in the second coaxial patterns 15. In one embodiment, the first width is same as the second width. In another embodiment, the first width is not equal to the second width, but the disclosure is not limited thereto.

In the embodiment, a patterned metal conductive layer is further disposed on the first insulation area or the second insulation area of the touch panel 10. For example, the patterned metal conductive layer on the first insulation area is configured to electrically connect to the active area 11 or other electrical components, but the disclosure is not limited thereto. In one embodiment, the patterned metal conductive layer can be formed by ion implantation or sputtering. In another embodiment, the patterned metal conductive layer can be formed by printing process, such as screen printing or gravure printing, but the disclosure is not limited thereto.

In conclusion, removing the transparent conductive layer on touch panel by the coaxial pattern of the disclosure can avoid over etching on the patterned area, and finish the patterning process in a lesser time. In general, laser patterning an inactive area of a 3.5" touch panel takes 3 minutes. With the coaxial patterning process of the disclosure, the process time can be shortened to less than 1 minute, which dramatically increases the production capacity of touch panels. Besides, by avoiding large turning angles in the design of coaxial pattern in the disclosure, the laser energy accumulated at the turning corner is reduced, so the coaxial pattering process and the coaxial pattern of the disclosure can be applied to substrates made of macromolecule materials.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A laser-patterned touch panel, comprising:
   an active area, configured at a center of the touch panel;
   an inactive area, wherein the inactive area is not overlapped with the active area, and a transparent conductive layer is disposed on the inactive area;
   a plurality of first coaxial patterns formed in the transparent conductive layer and surrounding the active area, wherein each pattern of the first coaxial patterns comprises a continuous line segment with a first width and partially overlaps with a neighboring one of the first coaxial patterns, and the first coaxial patterns are arranged to form a first insulation area; and
   a patterned conductive metal layer disposed on the first coaxial patterns forming the first insulation area.

2. The laser-patterned touch panel as claimed in claim 1, wherein a resistance of the plurality of first coaxial patterns is at least larger than 20M Ohm to form the first insulation area.

3. The laser-patterned touch panel as claimed in claim 1, further comprising a plurality of second coaxial patterns disposed between the active area and the first coaxial patterns, wherein a resistance of the second coaxial patterns is at least larger than 20M Ohm to form a second insulation area.

4. The laser-patterned touch panel as claimed in claim 1, wherein the transparent conductive layer is formed using Indium Tin Oxide (ITO), ZnO, silver nanowire, carbon nanotube, graphene, or PEDOT.

5. The laser-patterned touch panel as claimed in claim 1, wherein the touch panel is fabricated by ultra-thin flexible glass, polyethylene terephthalate (PET), polymide (PI), or polycarbonate (PC).

6. Laser-patterned touch panel as claimed in claim 1, wherein the first coaxial patterns respectively overlap along a direction of a lengthwise extension thereof.

7. A laser-patterned touch panel, comprising:
   a first inactive area, disposed on the touch panel and comprising a transparent conductive layer;
   a plurality of first coaxial patterns formed in the first inactive area of the transparent conductive layer and having a first axle center, the plurality of first coaxial patterns formed by removing portions of the transparent conductive layer, wherein the first coaxial patterns are formed by a continuous line segment with a first width, each of the first coaxial patterns partially overlaps with a neighboring one of the first coaxial patterns, and the first coaxial patterns are arranged to form a first insulation area; and
   a patterned conductive metal layer disposed on the first coaxial patterns forming the first insulation area.

8. The laser-patterned touch panel as claimed in claim 7, wherein the first axle center is a center or a center of gravity of the first inactive area.

9. The laser-patterned touch panel as claimed in claim 7, further comprising:
   a second inactive area, disposed on the touch panel, not overlapped with the first inactive area, and having the transparent conductive layer; and
   a plurality of second coaxial patterns, having a second axle center and disposed on the second inactive area, for removing the transparent conductive layer;
   wherein the second coaxial patterns are formed by another continuous line segment with a second width, and each of the second coaxial patterns partially overlaps with a neighboring one of the second coaxial patterns.

10. The laser-patterned touch panel as claimed in claim 9, wherein the second axle center is a center or a gravity of center of the second inactive area, and the first axle center is different from the second axle center.

11. Laser-patterned touch panel as claimed in claim 7, wherein the first coaxial patterns respectively overlap along a direction of a lengthwise extension thereof.

12. The laser-patterned touch panel as claimed in claim 7, further comprising the active area disposed at center of the touch panel and not overlapped with the first inactive area.

13. The laser-patterned touch panel as claimed in claim 12, wherein the first inactive area surrounds the active area, and the first axle center is a center or gravity of center of the inactive area.

* * * * *